(12) United States Patent
Goh et al.

(10) Patent No.: US 9,709,439 B2
(45) Date of Patent: Jul. 18, 2017

(54) LIGHT SENSITIVE CIRCUIT, LIGHT SENSING PANEL HAVING THE LIGHT SENSITIVE CIRCUIT AND DISPLAY APPARATUS HAVING THE LIGHT SENSING PANEL

(71) Applicant: Samsung Display Co., LTD., Yongin, Gyeonggi-Do (KR)

(72) Inventors: Joon-Chul Goh, Hwaseong-si (KR); Jae-Keun Lim, Suwon-si (KR)

(73) Assignee: Samsung Display Co., Ltd. (KR)

( * ) Notice: Subject to any disclaimer, the term of this patent is extended or adjusted under 35 U.S.C. 154(b) by 385 days.

(21) Appl. No.: 14/286,286

(22) Filed: May 23, 2014

(65) Prior Publication Data
US 2015/0041628 A1  Feb. 12, 2015

(30) Foreign Application Priority Data

Aug. 6, 2013 (KR) .......................... 10-2013-0092885

(51) Int. Cl.
| | |
|---|---|
| *G06F 3/038* | (2013.01) |
| *G01J 1/46* | (2006.01) |
| *G06F 3/041* | (2006.01) |
| *H01L 27/32* | (2006.01) |
| *G01J 1/44* | (2006.01) |

(52) U.S. Cl.
CPC .............. *G01J 1/46* (2013.01); *G06F 3/0412* (2013.01); *G01J 2001/444* (2013.01); *G01J 2001/4473* (2013.01); *H01L 27/3227* (2013.01); *H01L 27/3234* (2013.01)

(58) Field of Classification Search
CPC G06F 3/0412; G06F 3/042; G01J 1/46; G01J 2001/444; G01J 2001/4473; H01L 27/3227; H01L 27/3234; G01F 1/13338; G09G 2360/148; G09G 2360/144
See application file for complete search history.

(56) References Cited

U.S. PATENT DOCUMENTS

| | | | |
|---|---|---|---|
| 7,781,719 B2 | 8/2010 | Yang et al. | |
| 7,800,602 B2 | 9/2010 | Choi et al. | |
| 2007/0147132 A1 | 6/2007 | Lee et al. | |
| 2008/0105909 A1 | 5/2008 | Ham et al. | |
| 2009/0078975 A1 | 3/2009 | Kim et al. | |
| 2009/0236504 A1* | 9/2009 | Yamaguchi | G09G 3/3406 250/214.1 |

(Continued)

FOREIGN PATENT DOCUMENTS

| | | |
|---|---|---|
| KR | 1020090104319 A | 10/2009 |
| KR | 1020110077660 A | 7/2011 |
| KR | 1020130023641 A | 3/2013 |

*Primary Examiner* — Peter D McLoone
(74) *Attorney, Agent, or Firm* — Innovation Counsel LLP

(57) ABSTRACT

A light sensitive circuit includes a light sensing capacitor and a driving transistor. The light sensing capacitor is configured to sense light of a predetermined one or more wavelengths. The driving transistor includes a gate electrode electrically connected to the light sensing capacitor and is configured to generate a light sensing current according to a voltage of the gate electrode in the driving transistor. A light sensing accuracy and a light sensing signal to noise ratio (SNR) of the display apparatus including a plurality of such light sensing capacitors may be improved relative to ones that do not include such light sensing capacitors.

17 Claims, 8 Drawing Sheets

(56) References Cited

U.S. PATENT DOCUMENTS

| | | | |
|---|---|---|---|
| 2010/0039406 A1* | 2/2010 | Lee | G02F 1/13338 345/174 |
| 2010/0097352 A1* | 4/2010 | Ahn | G06F 3/0412 345/175 |
| 2011/0127991 A1* | 6/2011 | Senda | G06F 3/0412 324/96 |
| 2013/0033455 A1 | 2/2013 | Jeong et al. | |
| 2013/0100077 A1* | 4/2013 | Chung | G06F 3/042 345/175 |

* cited by examiner

LIGHT SENSITIVE CIRCUIT, LIGHT SENSING PANEL HAVING THE LIGHT SENSITIVE CIRCUIT AND DISPLAY APPARATUS HAVING THE LIGHT SENSING PANEL

PRIORITY STATEMENT

This application claims priority under 35 U.S.C. §119 to Korean Patent Application No. 10-2013-0092885, filed on Aug. 6, 2013 in the Korean Intellectual Property Office (KIPO), the contents of which application are herein incorporated by reference in their entireties.

BACKGROUND

1. Field of Disclosure

The present disclosure of invention relates to light sensitive circuits, a light sensing panel having such light sensitive circuits and an image displaying apparatus having the light sensing panel. More particularly, the present teachings relate to a light sensitive circuit including a light sensing capacitor which is sensitive to one or more wavelengths of light, a light sensing panel having the light sensitive circuit and a display apparatus having the light sensing panel.

2. Description of Related Technology

Light sensing elements may be embedded into image displaying apparatuses such as liquid crystal displays (LCDs) for the purpose of sensing external lights applied from an outside or sensing the blocking of such lights (e.g., detecting shadows). The capability may be used for example to detect various noncontact hand gestures made over the display area of a flat or otherwise thin panel display apparatus. In addition, the display apparatus may be made to determine and respond to the position(s) on the display area where the added or blocked light is sensed. Thus, for example when the external light is intended light of one or more predetermined wavelengths such as that of a laser pointer, the light sensing device may perform a user interface function based on the sensed location of one or more laser points.

However, the embedded light sensing elements might have a broad bandwidth of sensitivity such that they respond ambient light such as provided from lighting equipment and/or sunlight as well as responding to the wavelength(s) of the user intended light such as the laser point, and thus the light sensing device is prone to error due to noise arising for example from ambient light sources. Thus, light sensing sensitivity or accuracy of the display apparatus including the light sensing device might be decreased.

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding invention dates of subject matter disclosed herein.

SUMMARY

The present disclosure of invention provides a light sensitive circuit capable of increasing light sensing accuracy.

Exemplary embodiments of the present disclosure provide a light sensing panel having the above-mentioned light sensitive circuit embedded therein.

Exemplary embodiments of the present disclosure also provide a display apparatus having the above-mentioned light sensing panel.

According to an exemplary embodiment, a light sensitive circuit includes a light sensing capacitor and a driving transistor. The light sensing capacitor is configured to sense an intended and applied light or the absence thereof. The driving transistor includes a gate electrode electrically connected to the light sensing capacitor and is configured to generate a light sensing current according to a voltage of the gate electrode in the driving transistor.

In one embodiment, the light sensing capacitor and the driving transistor may be formed in a pixel unit of a display panel displaying an image.

In one embodiment, the light sensitive circuit may further include a first switching transistor configured to be driven in response to an (n+1)-th (n is a natural number) gate signal that is activated successively after an n-th gate signal and to transfer a driving reference voltage to the gate electrode in the driving transistor. The driving reference voltage is a reference voltage of the driving transistor.

In one embodiment, the light sensitive circuit may further include a coupling capacitor electrically connected to a gate electrode of the first switching transistor, to the gate electrode of the driving transistor and to the light sensing capacitor.

In one embodiment, the first switching transistor may be a photo transistor configured for sensing received light of a predetermined one or more wavelengths.

In one embodiment, the light sensitive circuit may further include a second switching transistor configured to be driven in response to the n-th gate signal and to transfer the light sensing current generated by the driving transistor to a readout line.

In one embodiment, a capacitance of the light sensing capacitor may be increased in proportion to an intensity of received light of a predetermined one or more wavelengths (e.g., in the IR band).

According to another exemplary embodiment of the present invention, a light sensing panel includes a light sensitive circuit, gate lines and data lines. The light sensitive circuit includes a light sensing capacitor configured to sense light, a driving transistor including a gate electrode electrically connected to the light sensing capacitor and configured to generate a light sensing current according to a voltage of the gate electrode in the driving transistor, and a first switching transistor configured to be driven in response to an (n+1)-th (n is a natural number) gate signal next to an n-th gate signal and transfer a driving reference voltage which is a reference voltage of the driving transistor to the gate electrode of the driving transistor. The gate lines transfer the n-th gate signal and the (n+1)-th gate signal. The data lines intersect with the gate lines and transfer data signals.

In one embodiment, the light sensing panel may further include a readout line transferring the light sensing current.

In one embodiment, the light sensitive circuit may further include a second switching transistor configured to be driven in response to the n-th gate signal and transfer the light sensing current generated by the driving transistor to the readout line.

In one embodiment, the light sensing panel may be a display panel configured for displaying an image.

In one embodiment, the light sensing panel may further include a thin film transistor including a gate electrode electrically connected to the gate line and a source electrode electrically connected to the data line, a liquid crystal capacitor electrically connected to a drain electrode of the thin film transistor, and a storage capacitor electrically connected to the drain electrode of the thin film transistor.

In one embodiment, the light sensing panel may further include a switching thin film transistor electrically connected to the gate line and the data line, a driving thin film transistor electrically connected to the switching thin film transistor and a power line, an organic light emitting diode (OLED) electrically connected to the driving thin film transistor, and a storage capacitor electrically connected to the switching thin film transistor and the power line.

In one embodiment, the light sensitive circuit may further include a coupling capacitor electrically connected to a gate electrode of the first switching transistor, the gate electrode of the driving transistor and the light sensing capacitor.

In one embodiment, the first switching transistor may be a photo transistor configured for sensing the light.

In one embodiment, a capacitance of the light sensing capacitor may be increased in proportion to an intensity of the light.

According to still another exemplary embodiment, a display apparatus includes a light sensing panel, a gate lines driving part and a data lines driving part. The light sensing panel includes a light sensitive circuit including a light sensing capacitor configured to sense light, a driving transistor including a gate electrode electrically connected to the light sensing capacitor and configured to generate a light sensing current according to a voltage of the gate electrode in the driving transistor and a first switching transistor configured to be driven in response to an (n+1)-th (n is a natural number) gate signal next to an n-th gate signal and transfer a driving reference voltage which is a reference voltage of the driving transistor to the gate electrode of the driving transistor, gate lines transferring the n-th gate signal and the (n+1)-th gate signal, and data lines intersecting with the gate lines and transferring data signals. The gate lines driving part is configured to output the n-th gate signal and the (n+1)-th gate signal to the data lines. The data lines driving part is configured to output data signals to the data lines.

In one embodiment, the light sensing panel may further include a readout line transferring the light sensing current.

In one embodiment, the display apparatus may further include a readout circuit part electrically connected to the readout line, and configured to receive the light sensing current to output an output voltage corresponding to the light sensing current.

In one embodiment, the readout circuit part may include an amplifier including an inverting terminal to which the light sensing current is applied, a non-inverting terminal to which an amplifier reference voltage is applied and an output terminal outputting the output voltage, a feedback capacitor electrically connected between the inverting terminal of the amplifier and the output terminal of the amplifier, and a switch configured to selectively connect the inverting terminal of the amplifier and the output terminal of the amplifier.

According to the present disclosure of invention, an effect of ambient light compared with intended external light such as that of a pre-specified laser pointer may be decreased using a light sensing capacitor configured for sensing light having the wavelengths of the pre-specified laser pointer. Thus, light sensing accuracy and light sensing signal to noise ratio (SNR) of a display apparatus including the light sensing capacitor may be improved.

BRIEF DESCRIPTION OF THE DRAWINGS

The above and other features and advantages of the present disclosure of invention will become more apparent by describing in detailed exemplary embodiments thereof with reference to the accompanying drawings, in which.

DETAILED DESCRIPTION

Hereinafter, the present disclosure of invention will be explained in detail with reference to the accompanying drawings.

Figure 1:
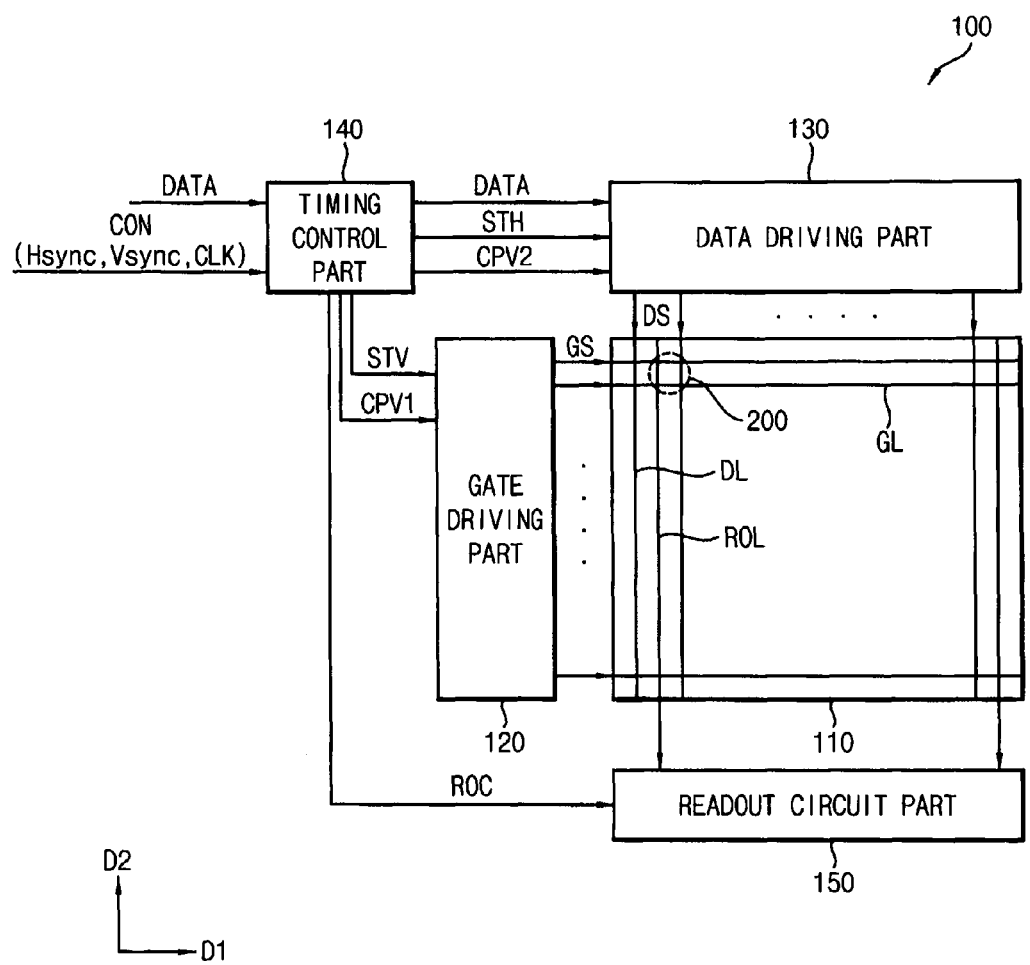
FIG. 1 is a block diagram illustrating a display apparatus according to an exemplary embodiment of the present disclosure of invention.

FIG. 1 is a block diagram illustrating a display apparatus according to an exemplary embodiment.

Referring to FIG. 1, a display apparatus 100 in accordance with the present disclosure includes a display panel 110 having light sensing elements embedded therein, a gate lines driving part 120, a data lines driving part 130, a timing control part 140 and a readout circuit part 150.

The display panel 110 receives data line drive signals DS having magnitudes based on an image data signal DATA provided from an external source where the data line drive signals DS are used to display a desired image (e.g., a colored 2D or 3D image). More specifically, the supplied image data signal DATA may represent a two-dimensional plane image or, alternatively, the image data signal DATA may include left-eye image data and right-eye image data for use in displaying a three-dimensional stereoscopic image.

The display panel 110 includes gate lines GL, data lines DL, readout lines ROL and a plurality of pixel units 200. In one embodiment, all the pixel units each include at least one light sensing element. In an alternate embodiment, less than all the pixel units each includes an embedded light sensing element or a one light sensing element may extend adjacent to a plurality of pixel units. The gate lines GL of the panel 110 extend in a first direction D1 while the data lines DL extend in a second direction D2 substantially perpendicular to the first direction D1. The light sense readout lines ROL extend in the second direction D2. Although not shown in FIG. 1, the display panel 110 may be elongated such that the first direction D1 is parallel with a longer side of the display panel 110 and the second direction D2 is parallel with a shorter side of the display panel 110.

Figure 2:
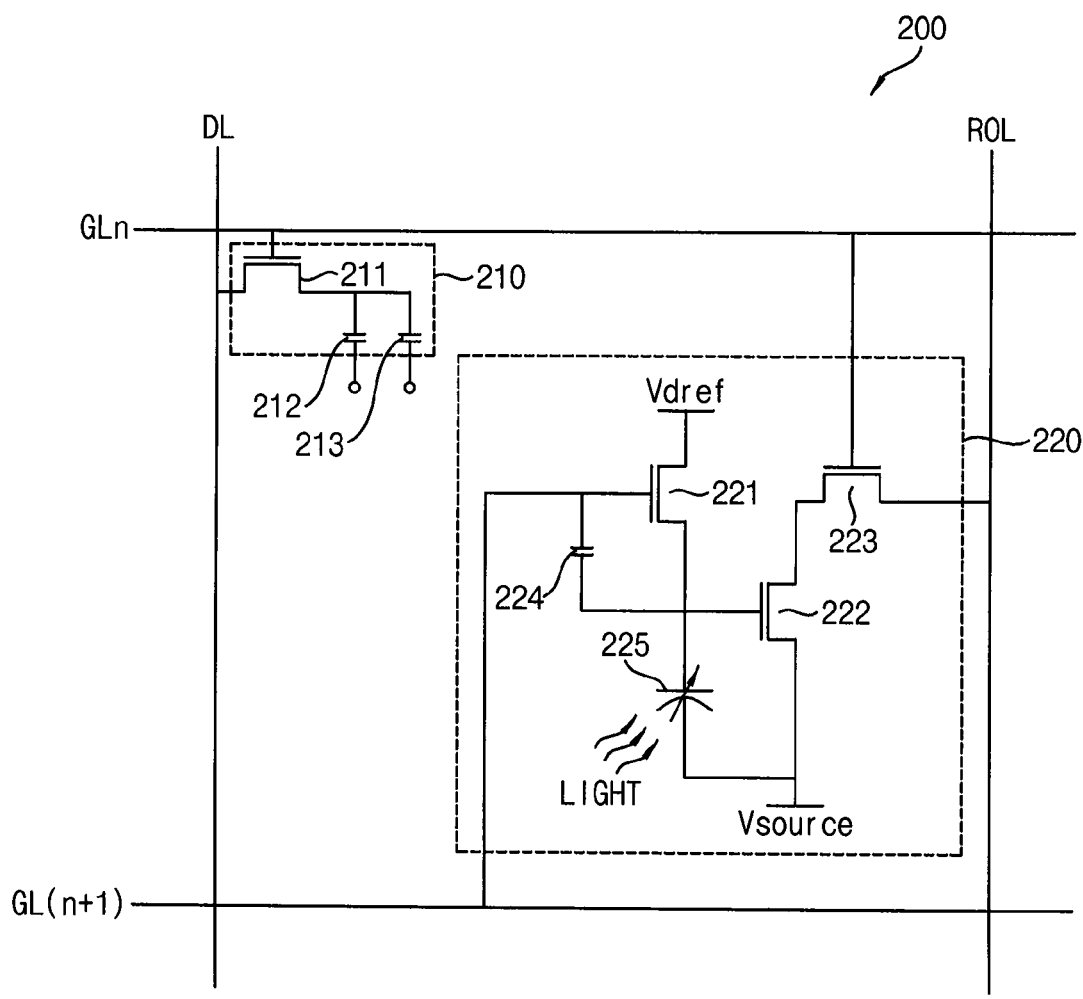
FIG. 2 is a circuit diagram illustrating a pixel unit that includes a light sensing element as provided in a display panel such as that of FIG. 1.

FIG. 2 is a circuit diagram illustrating an exemplary pixel unit 200 included in the display panel 110 of FIG. 1.

Referring to FIGS. 1 and 2, and for one embodiment, each of the pixel units 200 includes an image displaying circuit part 210 and a light sensitive circuit part 220.

The image displaying circuit part 210 performs a function of displaying the image on the display panel 110. Specifically, the image displaying circuit part 210 includes a first thin film transistor 211 electrically connected to an n-th (n is a natural number) gate line GLn among the gate lines GL and connected to a corresponding one DL of the data lines. The image displaying circuit part 210 further includes a liquid crystal capacitor 212 and a storage capacitor 213 connected to the first thin film transistor 211.

The light sensitive circuit part 220 is configured to be sensitive to one or more predetermined wavelengths of a supplied light LIGHT. For example, the light LIGHT may be intended external light such as that of a laser pointer where the laser pointer outputs wavelengths in the visible or adjacent (e.g., IR) wavelength ranges. Thus, the display panel 110 including the pixel units 200 in which the light sensitive circuit part 220 is formed may act as a light sensing panel. The light sensitive circuit part 220 includes a first switching transistor 221 (a.k.a. resetting TFT 221), a driving transistor 222 (a.k.a. capacitor-driven TFT 222), a second switching transistor 223 (a.k.a. readout TFT 223), a coupling capacitor 224 and a light sensing capacitor 225.

The first switching transistor 221 is driven (activated) in response to an (n+1)-th activating gate signal applied by way of an (n+1)-th gate line GL(n+1) which may be located next to the n-th gate line GLn. When activated, the first switching transistor 221 (a.k.a. resetting TFT 221) transfers a reference driving voltage Vdref which has a predetermined reference voltage level to both the gate electrode of the driving transistor 222 and to a connected first end of the variable, light sensitive capacitor 225. At the same time, the voltage level of the activating gate signal is applied to a connected first end of the coupling capacitor 224. Yet more specifically, the first switching transistor 221 includes a gate electrode electrically connected to the (n+1)-th gate line GL(n+1), a source electrode receiving the driving reference voltage Vdref and a drain electrode electrically connected to the gate electrode of the driving transistor 222. In this operation, the second switching transistor 223 (a.k.a. readout TFT 223) is turned off because the (n)-the gate line GL(n) has been switched to a deactivated state. Therefore, the coupling capacitor 224 is precharged to the difference between Vdref and the voltage then on the (n+1)-th gate line GL(n+1). At the same time, the variable, light sensitive capacitor 225 is precharged to the difference between Vdref and Vsource. Thereafter, the (n+1)-th gate line GL(n+1) is deactivated and the charges precharged into capacitor 224 and 225 realign themselves accordingly.

When activated at a later time, the driving transistor 222 generates a light sensing current according to a voltage then present on its gate electrode. More specifically, the driving transistor 222 includes the gate electrode electrically connected to the first switching transistor 221, the coupling capacitor 224 and the light sensing capacitor 225, a source electrode receiving a predetermined source voltage Vsource and a drain electrode electrically connected to the second switching transistor 223.

The second switching transistor 223 is driven (activated) in response to an activating n-th gate signal applied to the n-th gate line GLn and when activated allows a light sensing current passing through the driving transistor 222 to continue through the readout line ROL in response to such an activating n-th gate signal. Specifically, the second switching transistor 223 includes a gate electrode electrically connected to the n-th gate line GLn, a source electrode electrically connected to the driving transistor 222 and a drain electrode electrically connected to the readout line ROL.

The coupling capacitor 224 includes a first electrode electrically connected to the gate electrode of the first switching transistor 221 and a second electrode electrically connected to the gate electrode of the driving transistor 222. The coupling capacitor 224 generates a kickback voltage when the (n+1)-th gate line GL(n+1) is deactivated.

The light sensing capacitor 225 is responsive to one or more wavelengths of the intentionally applied light LIGHT (which light can arrive at element 225 after optionally passing through an optical filter (not shown) provided adjacent to element 225. More specifically, the size of a charge carriers containing conductive channel in example 226 (FIG. 3) is increased when the light LIGHT is applied and disassociated electron-hole pairs are generated in response to absorption of photons of the light LIGHT. Thus, a capacitance of the light sensing capacitor 225 is increased in proportion to an intensity of the applied light LIGHT. As the capacitance of the light sensing capacitor 225 increases, the voltage there across changes (for example, because V=Q/C) and the state of the driving transistor 222 (a.k.a. capacitor-driven TFT 222) changes accordingly. The light sensing capacitor 225 includes a first electrode electrically connected to the gate electrode of the driving transistor 222 and a second electrode electrically connected to the source electrode of the driving transistor 222.

Figure 3:
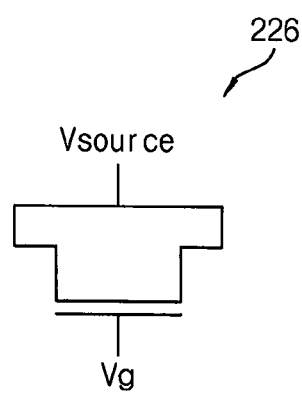
FIG. 3 is a circuit diagram illustrating a light sensing transistor that is connected so as to realize a light sensitive capacitor such as that of FIG. 2.

FIG. 3 is a circuit diagram illustrating an example of light sensing transistor 226 connected for realizing the light sensing capacitor 225 of FIG. 2.

Referring to FIGS. 2 and 3, the light sensing capacitor 225 may be realized in the light sensing transistor 226. For example, the light sensing transistor 226 may be a PMOS transistor and may be an amorphous silicon transistor. The light sensing transistor 226 includes a gate electrode receiving a gate voltage Vg. When a negative voltage is applied to the gate electrode of the light sensing transistor 226 and the light LIGHT is applied to the light sensing transistor 226, disassociated electron-hole pairs are generated in response to absorption of photons of the light LIGHT where the positive ones of these disassociated charge carriers (holes) drift toward and are collected at an interface of the channel region (e.g., an N-type channel) and the corresponding gate insulating layer. At the same time, a positive current flows into the source and drain regions of light sensing transistor 226 to combine with the disassociated negative charges (e.g., electrons) formed in the channel region (e.g., an N-type channel). The generation speed of such positive charge carriers (in the presence of the negative Vg) collecting adjacent to the gate electrode and of such disassociated negative charges (e.g., electrons) drifting toward the source and drain regions (e.g., both of P type conductivity in the exemplary PMOS transistor) is increased in proportion to the intensity of the absorbed light photons of the LIGHT (photons of appropriate wavelength(s)). The channel region may be appropriately doped for absorption of the desired kinds of photons (e.g., those coming from the laser pointer having predetermined spectrum components).

Figure 4:
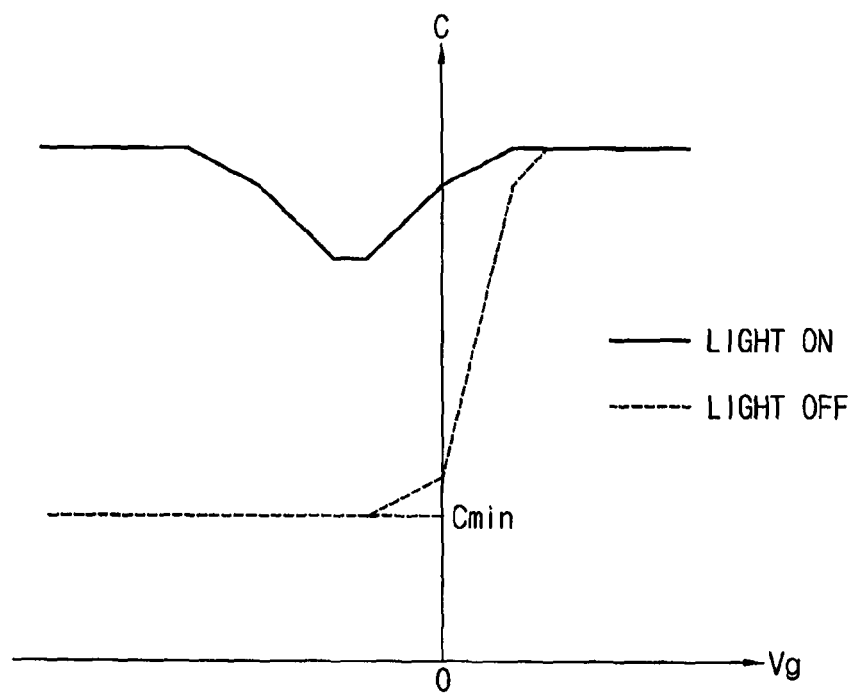
FIG. 4 is a graph illustrating a variable capacitance which varies as a function of applied light and according to a gate voltage applied to the light sensing transistor of FIG. 3.

FIG. 4 is a graph illustrating a capacitance according to the gate voltage Vg of the light sensing transistor 226 of FIG. 3. In this case the voltage (e.g., Vsource) present at the source and drain terminals of light sensing transistor 226 may be assumed to be 0V.

Referring to FIGS. 3 and 4, when the gate voltage Vg applied to the gate electrode of the light sensing transistor 226 is a negative voltage (relative to the source and drain voltage, e.g., Vsource), a capacitance of the light sensing transistor 226 in case the light LIGHT is applied to the light sensing transistor 226 is greater than the capacitance of the light sensing capacitor 226 in case the light LIGHT is not applied to the light sensing capacitor 226.

An operation of the light sensitive circuit part 220 in FIG. 2 provides a desired negative gate voltage Vg to the gate of transistor 226 as explained in the following.

When the (n+1)-th gate signal is activated (e.g., goes high), the first switching transistor 221 is activated (rendered conductive) and it then transfers the driving reference voltage Vdref to the gate electrode of the driving transistor 222 in response to that activation of the (n+1)-th gate signal applied to the (n+1)-th gate line GL(n+1).

Soon thereafter, when the (n+1)-th gate signal is next deactivated, a negative kickback voltage is generated due to the AC part of the dropping gate voltage passing through the coupling capacitor 224 and to the gate electrode of the light sensing capacitor 225.

The magnitude of the kickback voltage in the case where the light sensing capacitor 225 receives the light LIGHT may be calculated by equation 1. The magnitude of the kickback voltage in the case where the light sensing capacitor 225 does not receive the light LIGHT may be calculated by equation 2. (These are nonlimiting examples.)

$$LMC\, Vkb = \frac{Cp}{Cp + C\min + \Delta C} \times \Delta VG[n+1] \quad \text{[Equation 1]}$$

$$LMC\, Vkb = \frac{Cp}{Cp + C\min} \times \Delta VG[n+1] \quad \text{[Equation 2]}$$

Here, Vkb denotes the kickback voltage, Cp denotes a capacitance of the coupling capacitor 224, Cmin denotes a minimum capacitance of the light sensing capacitor 225, $\Delta C$ denotes a capacitance change of the light sensing capacitor 225 due to generation of free holes, and $\Delta VG[n+1]$ denotes a voltage change of the (n+1)-th gate signal.

Referring to equation 1 and equation 2, the kickback voltage in case the light sensing capacitor 225 receives the light LIGHT is less than the kickback voltage in case the light sensing capacitor 225 does not receive the light LIGHT (and therefore there is no generation of free holes). Therefore, the voltage of the gate electrode in the driving transistor 222 in case the light sensing capacitor 225 receives the light LIGHT is greater than the voltage of the gate electrode in the driving transistor 222 in case the light sensing capacitor 225 does not receive the light LIGHT. Thus, the light sensing current generated from the driving transistor 222 (e.g., an NMOS transistor) is increased in proportion to the intensity of the light LIGHT.

The minimum capacitance of the light sensing capacitor 225 is proportional to a channel width of the light sensing transistor 226. Thus, a capacitance change ratio of the light sensing capacitor 225 according to reception of the light LIGHT or not is increased as a ratio width/length of the light sensing transistor 226 is made less (where length is assumed to remain constant).

Figure 5A:
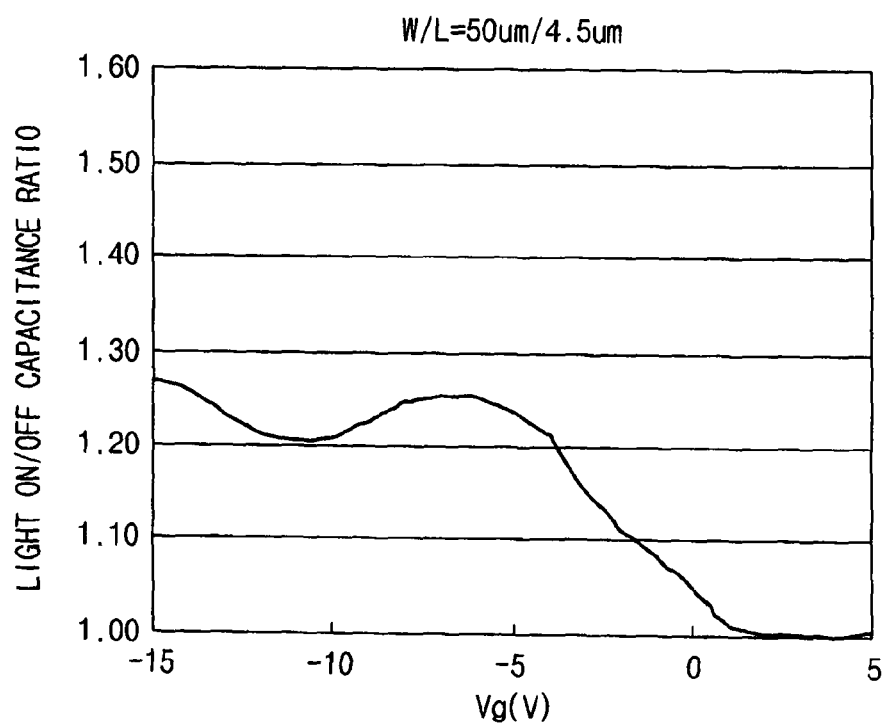
FIG. 5A is a simulation graph illustrating a capacitance change ratio relative to gate voltage of the light sensing capacitor according to a reception of light when a width/length (W/L) factor of the light sensing transistor is a first ratio.
Figure 5B:
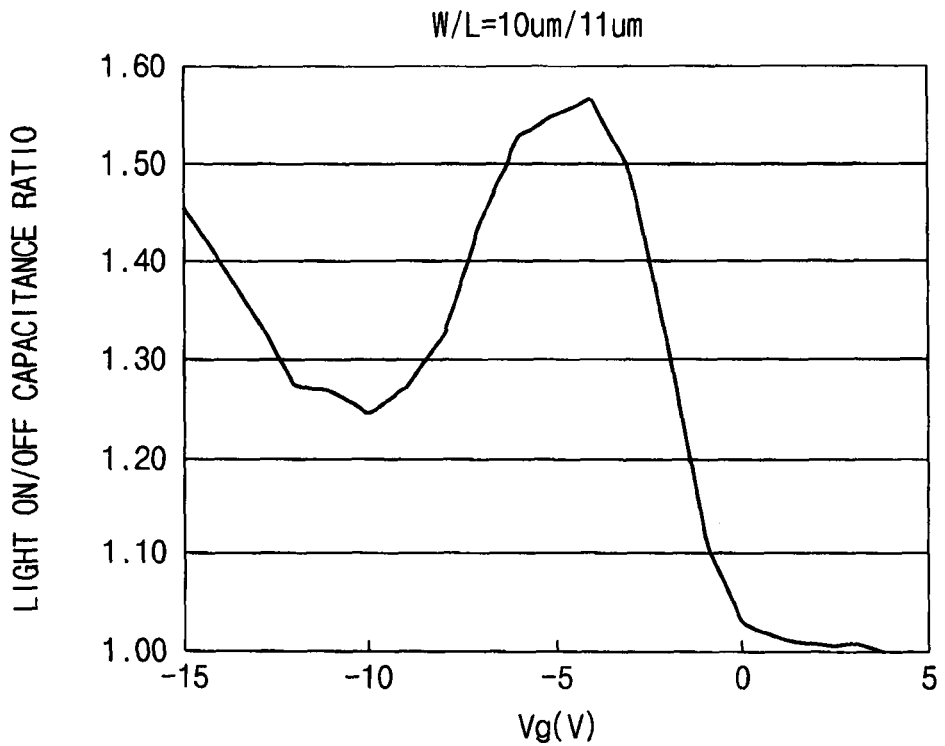
FIG. 5B is a simulation graph illustrating a capacitance change ratio relative to gate voltage of the light sensing capacitor according to the reception of the light when the width/length (W/L) factor of the light sensing transistor is a second ratio less than the first ratio.

FIG. 5A is a simulation graph illustrating a capacitance change ratio of the light sensing capacitor 225 according to the reception of the light LIGHT when the width/length ratio of the light sensing transistor 226 is a first ratio value, and FIG. 5B is a simulation graph illustrating a capacitance change ratio of the light sensing capacitor 225 according to the reception of the light LIGHT when the width/length of the light sensing transistor 226 is a second ratio value less than the first ratio value.

Referring to FIGS. 2 to 5B, a maximum capacitance change ratio of the light sensing capacitor 225 according to the reception of the light LIGHT when the width/length of the light sensing transistor 226 is about 50/4.5 of the first ratio was about 1.28, and a maximum capacitance change ratio of the light sensing capacitor 225 according to the reception of the light LIGHT when the width/length of the light sensing transistor 226 is smaller, about 10/11 of the second ratio was about 1.56. Thus, the capacitance change ratio of the light sensing capacitor 225 according to the reception of the light LIGHT is increased as the ratio of the width/length of the light sensing transistor 226 is made less.

Referring to FIG. 2 again, when the n-th gate signal is an activating one applied to the n-th gate line GLn after a frame period has elapsed, the second switching transistor 223 transfers the light sensing current generated from the driving transistor 222 to the readout line ROL in response to the n-th gate signal.

Referring to FIG. 1 again, the gate driving part 120 generates a gate signal GS in response to a gate start signal STV and a gate clock signal CPV1 provided from the timing control part 140, and outputs successive ones of momentarily active gate signals GS to the successive gate lines GL.

The data driving part 130 outputs the data signals DS based on the received image data DATA to the data lines DL, in synchronized response to a data start signal STH and a data clock signal CPV2 provided from the timing control part 140.

The timing control part 140 receives the image data DATA and a control signal CON from an outside source. The control signal CON may include a horizontal synchronizing signal Hsync, a vertical synchronizing signal Vsync and a clock signal CLK. The timing control part 140 generates the data start signal STH using the horizontal sync signal Hsync and outputs the data start signal STH to the data driving part 130. In addition, the timing control part 140 generates the gate start signal STV using the vertical sync signal Vsync and outputs the gate start signal STV to the gate driving part 120. In addition, the timing control part 140 generates the gate clock signal CLK1 and the data clock signal CLK2 using the clock signal CLK, outputs the gate clock signal CLK1 to the gate driving part 120 and outputs the data clock signal CLK2 to the data driving part 130. In addition, the timing control part 140 may further output a readout control signal ROC controlling the readout circuit part 150 to the readout circuit part 150. The readout control signal ROC may control a driving timing of the readout circuit part 150.

The readout circuit part 150 is connected to the readout lines ROL and receives the corresponding light sensing currents transferred from the readout lines ROL to output corresponding output voltages associated with the respective light sensing currents.

Figure 6:
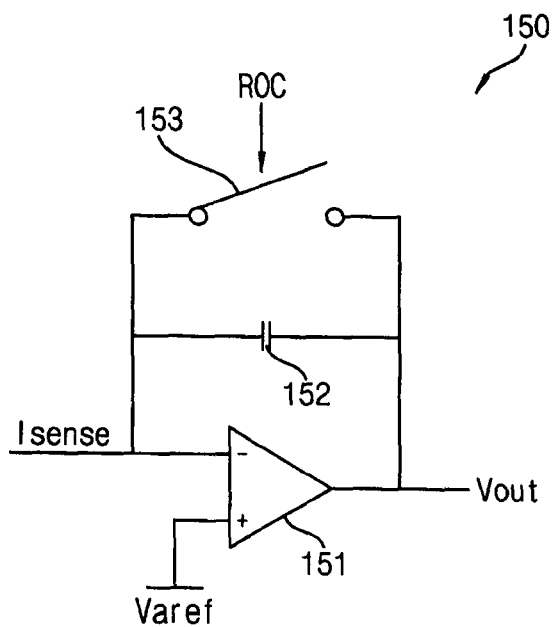
FIG. 6 is a circuit diagram illustrating a readout circuit part usable in the panel of FIG. 1.

FIG. 6 is a circuit diagram illustrating an exemplary current-to-voltage converting readout circuit part 150 that may be used in the device of FIG. 1.

Referring to FIGS. 1 and 6, the exemplary readout circuit part 150 includes an operational amplifier 151, a feedback capacitor 152 and a reset switch 153.

The amplifier 151 includes an inverting terminal receiving the light sensing current Isense transferred from the readout line ROL, a non-inverting terminal receiving an amplifier reference voltage Varef, and an output terminal configured to output the output voltage Vout corresponding to a light sensing current Isense received while the reset switch 153 is open.

The feedback capacitor 152 is electrically connected between the inverting terminal of the amplifier 151 and the output terminal of the amplifier 151.

The switch 153 is selectively connects the inverting terminal of the amplifier 151 and the output terminal of the amplifier 151. For example, the switch 153 may temporarily electrically connect the inverting terminal of the amplifier 151 and the output terminal of the amplifier 151 in response to the readout control signal ROC received from the timing control part 140. Thereafter, the reset switch 153 opens and the circuit produces an output voltage signal (Vout) corresponding to an over time integration of the light sensing current Isense received while the reset switch 153 is open. The output voltage signal (Vout) is stored and/or converted to a digital value before the switch 153 is again temporarily closed.

According to the present exemplary embodiment, the light LIGHT is sensed using the light sensing capacitor 225, effect of ambient light compared with the intended external light such as the laser pointer may be decreased. Thus, light sensing accuracy and light sensing signal to noise ratio (SNR) of the display apparatus 100 including the light sensing capacitor 225 may be improved.

Figure 7:
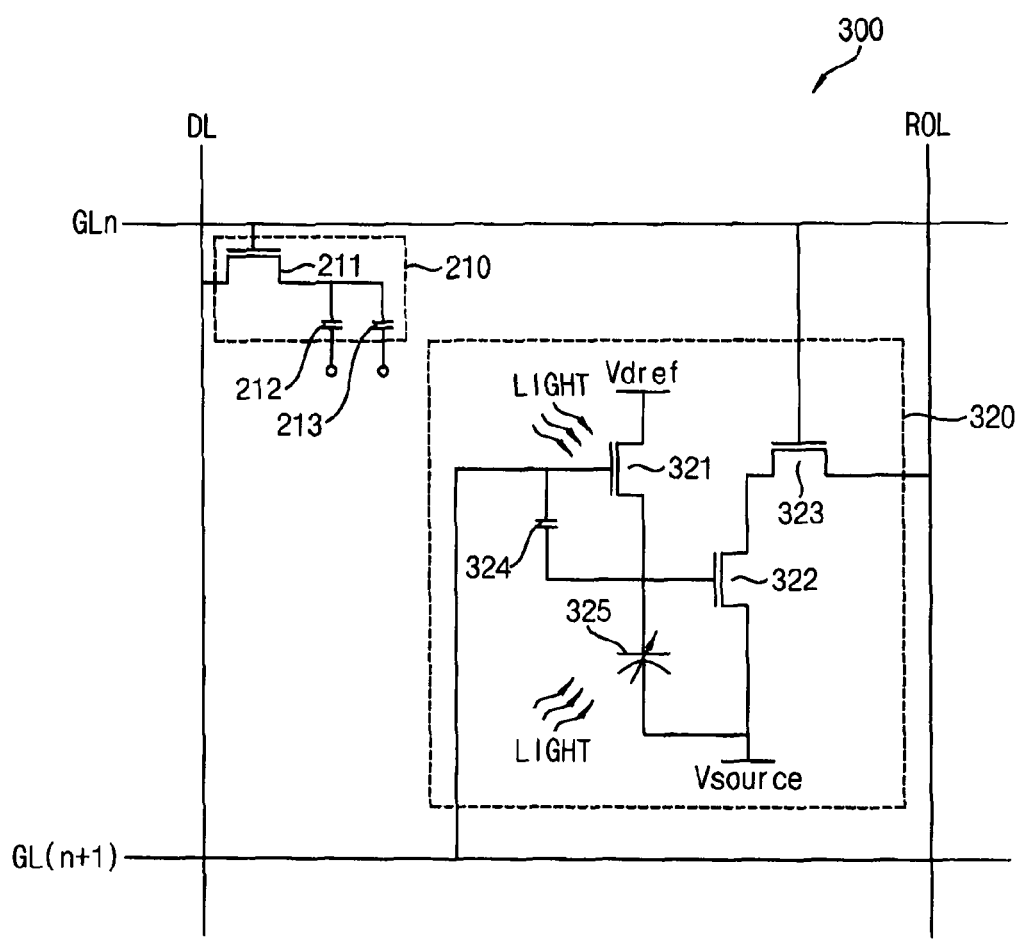
FIG. 7 is a circuit diagram illustrating a pixel unit that includes a light sensing element as provided according to another exemplary embodiment of the present disclosure of invention.

FIG. 7 is a circuit diagram illustrating a pixel unit according to another exemplary embodiment.

The pixel unit 300 according to the present exemplary embodiment may be in the display panel 110 of the display apparatus 100 according to the previous exemplary embodiment illustrated in FIG. 1, and the pixel unit 300 according to the present exemplary embodiment may be substituted for the pixel unit 200 according to the previous exemplary embodiment illustrated in FIG. 2 except that transistor 321 of the present exemplary embodiment is a light sensitive one. Substantially similar reference numerals in the 300 century series will be used here to refer to same or like parts as those described in the previous exemplary embodiment and any further repetitive explanation concerning the above elements will be omitted.

Referring to FIG. 7, the pixel unit 300 includes the image displaying circuit part 210 and a light sensitive circuit part 320.

The image displaying circuit part 210 performs a function of displaying the image on the display panel 110. Specifically, the image displaying circuit part 210 includes the thin film transistor 211 electrically connected to the n-th (n is a natural number) gate line GLn among the gate lines GL and the corresponding data line DL, the liquid crystal capacitor 212 and the storage capacitor 213 connected to the thin film transistor 211.

The light sensitive circuit part 320 senses the intended light LIGHT. For example, the light LIGHT may be intended external light such as that from a laser pointer having a pre-specified one or more wavelengths as its output. The light sensitive circuit part 320 includes a first switching transistor 321 (a light sensitive one that is exposed to the LIGHT signal), a driving transistor 322, a second switching transistor 323, a coupling capacitor 324 and a light sensing capacitor 325.

The first switching transistor 321 is driven in response to the (n+1)-th gate signal applied to the (n+1)-th gate line GL(n+1) next to the n-th gate line GLn, and transfers a driving reference voltage Vdref which is a reference voltage of the driving transistor 322 to a gate electrode of the driving transistor 322. Specifically, the first switching transistor 321 includes a gate electrode electrically connected to the (n+1)-th gate line GL(n+1), a source electrode receiving the driving reference voltage Vdref and a drain electrode electrically connected to the gate electrode of the driving transistor 322. In addition, the first switching transistor 321 is optically coupled to sense the applied light LIGHT and to generate a corresponding photo current or to change in its source to drain resistance ($R_{DS}$) in response to such applied light LIGHT. Thus, the first switching transistor 321 may be a photo transistor.

The driving transistor 322 generates a light sensing current according to a voltage of the gate electrode in the driving transistor 322. Specifically, the driving transistor 322 includes the gate electrode electrically connected to the first switching transistor 321, the coupling capacitor 324 and the light sensing capacitor 325, a source electrode receiving a source voltage Vsource and a drain electrode electrically connected to the second switching transistor 323.

The second switching transistor 323 is driven in response to the n-th gate signal applied to the n-th gate line GLn and transfers the light sensing current generated from the driving transistor 322 to the readout line ROL in response to the n-th gate signal. Specifically, the second switching transistor 323 includes a gate electrode electrically connected to the n-th gate line GLn, a source electrode electrically connected to the driving transistor 322 and a drain electrode electrically connected to the readout line ROL.

The coupling capacitor 324 includes a first electrode electrically connected to the gate electrode of the first switching transistor 321 and a second electrode electrically connected to the gate electrode of the driving transistor 322. The coupling capacitor 324 generates a kickback voltage when (n+1)-th gate line GL(n+1) is deactivated.

The light sensing capacitor 325 senses the light LIGHT. Thus, a capacitance of the light sensing capacitor 325 is increased in proportion to an intensity of the light LIGHT. The light sensing capacitor 325 includes a first electrode electrically connected to the gate electrode of the driving transistor 322 and a second electrode electrically connected to the source electrode of the driving transistor 322.

An operation of the light sensitive circuit part 320 in FIG. 7 is the same as following.

The first switching transistor 321 transfers the driving reference voltage Vdref to the gate electrode of the driving transistor 322 in response to the (n+1)-th gate signal applied to the (n+1)-th gate line.

When the (n+1)-th gate signal is inactivated, the kickback voltage is generated due to the coupling capacitor 324 and the light sensing capacitor 325. The kickback voltage may be calculated by equation 1 and equation 2. Thus, the kickback voltage in case the light sensing capacitor 325 receives the light LIGHT is less than the kickback voltage in case the light sensing capacitor 325 does not receive the light LIGHT. Therefore, the voltage of the gate electrode in the driving transistor 322 in case the light sensing capacitor 325 receives the light LIGHT is greater than the voltage of the gate electrode in the driving transistor 322 in case the light sensing capacitor 325 does not receive the light LIGHT. In addition, the first switching transistor 321 senses the light LIGHT during the frame period and generates the photo current to thereby supply charge for storage into capacitors 324 and 325, and thus the voltage of the gate electrode in the driving transistor 322 is increased. Thus, the light sensing current generated from the driving transistor 322 is increased in proportion to the intensity of the light LIGHT. Although in one embodiment, both of the first switching transistor 321 and the light sensing capacitor 325 are responsive to the same one or more wavelengths, it is within the contemplation of the present disclosure to make them responsive (e.g., by way of appropriate optical filters, not shown) to different wavelengths such that the output current, Isense is different based on the received wavelengths of light LIGHT.

When the n-th gate signal is activated and applied by way of the n-th gate line GLn after the frame period is elapsed, the second switching transistor 323 transfers the light sensing current generated from the driving transistor 322 to the readout line ROL in response to the activated n-th gate signal.

The readout circuit part 150 is connected to the readout line ROL and receives the light sensing current transferred from the readout line ROL to output an output voltage corresponding to the light sensing current.

Figure 8:
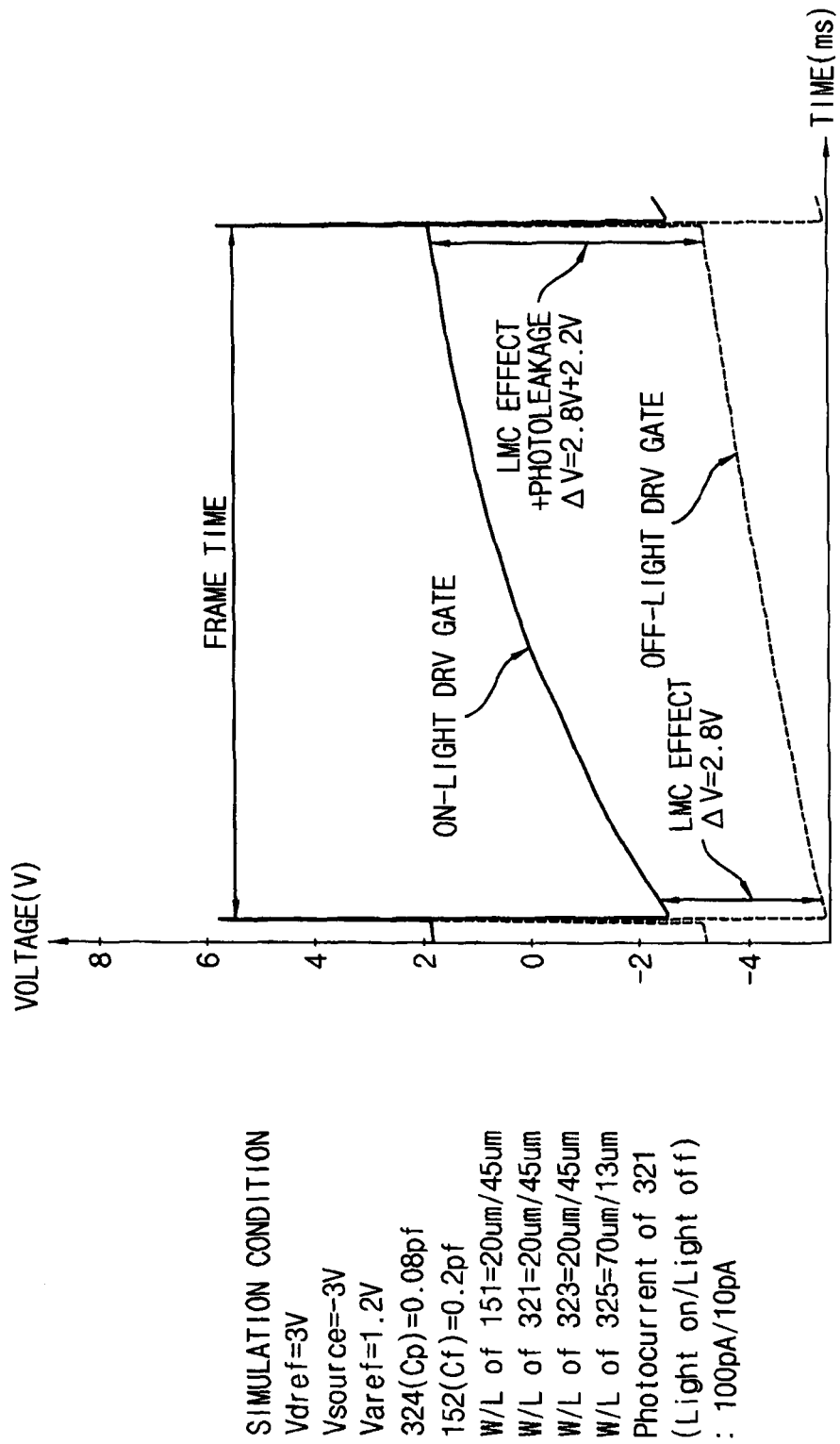
FIG. 8 is a simulation graph illustrating comparative results for different voltages of the gate electrode in a driving transistor in FIG. 7 in case where light is applied to the pixel unit and in case the light is not applied to the pixel unit.

FIG. 8 is a simulation graph illustrating the voltages of the gate electrode in the driving transistor 322 in FIG. 7 in case the light LIGHT is applied to the pixel unit 300 and in case the light LIGHT is not applied to the pixel unit 300.

Referring to FIGS. 6 to 8, a condition of the simulation is the same as following.

The driving reference voltage Vdref was about 3 V (volt), the source voltage Vsource was about −3 V (volt), the amplifier reference voltage Varef was about 1.2 V (volt), a capacitance of the coupling capacitor 324 was about 0.08 pf (pico farad), a capacitance of the feedback capacitor 152 was about 0.2 pf (pico farad), a width/length of the amplifier 151 was about 20/45, a width/length of the first switching transistor 321 was about 20/45, a width/length of the second switching transistor 323 was about 20/45, a width/length of the light sensing capacitor 325 was about 70/13, a photo current of the first switching transistor 321 in case the light LIGHT is applied to the pixel unit 300 was about 100 pA (pico ampere), and a photo current of the first switching transistor 321 in case the light LIGHT is not applied to the pixel 300 was about 10 pA (pico ampere).

A voltage change of the gate electrode in the driving transistor 322 due to the light sensing transistor 325 according to the appliance of the light LIGHT over the frame period was about 2.8 V (volt). In addition, a voltage change of the gate electrode in the driving transistor 322 due to the photo current generated from the first switching transistor 321 was about 2.2 V (volt). Therefore, a voltage change of the gate electrode in the driving transistor 322 due to the light sensing transistor 325 and the first switching transistor 321 according to the appliance of the light LIGHT was about 5.0 V (volt).

Figure 9:
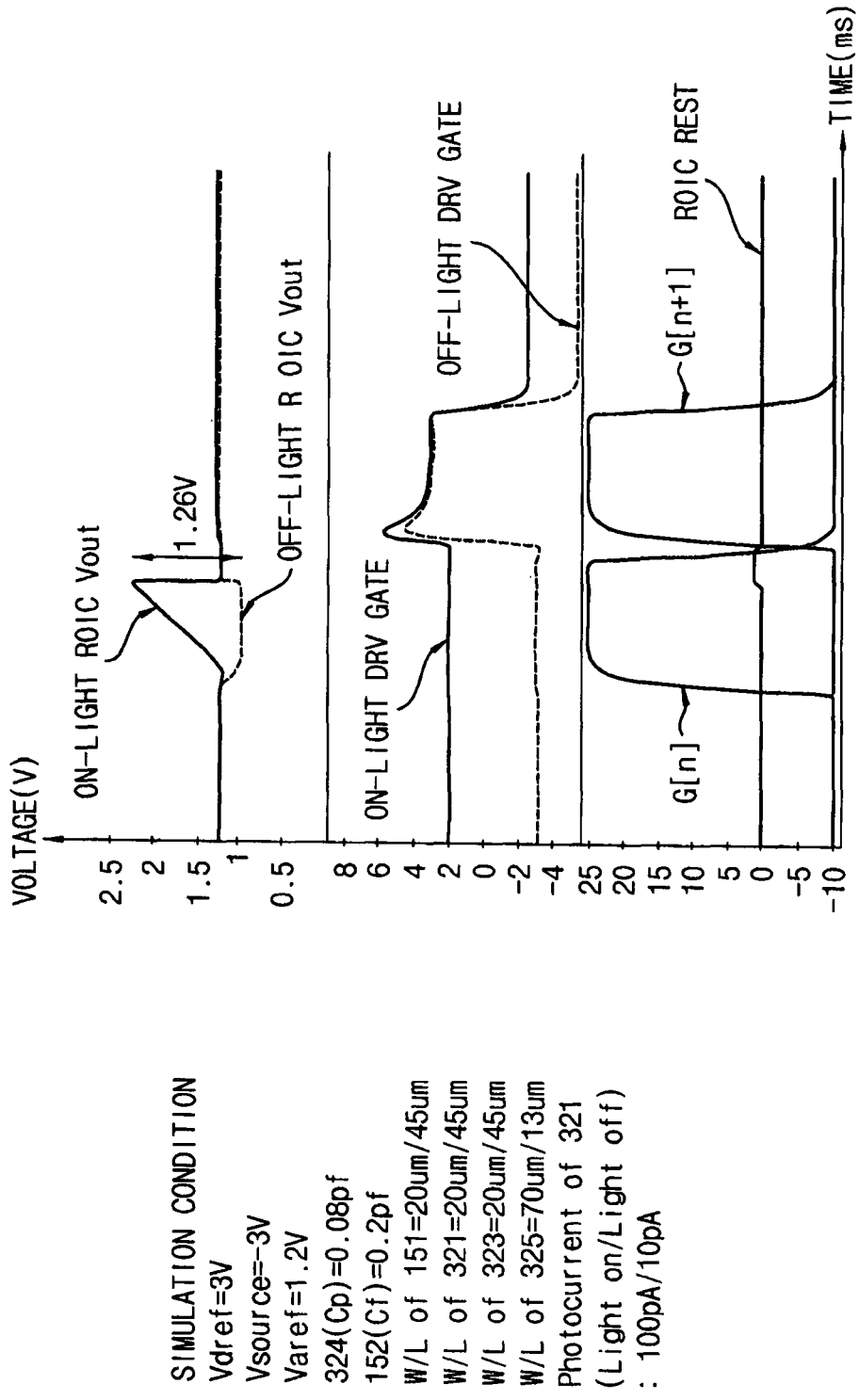
FIG. 9 is a graph illustrating an n-th gate signal applied to an n-th gate line, an (n+1)-th gate signal applied to an (n+1)-th gate line, the voltage of the gate electrode in the driving transistor and an output voltage output from the readout circuit part.

FIG. 9 is a timing graph illustrating the n-th gate signal applied by way of the n-th gate line GLn, and of the (n+1)-th gate signal as applied by way of the (n+1)-th gate line GL(n+1), and of the voltage of the gate electrode in the driving transistor 322 and of the output voltage Vout output from the readout circuit part 150.

Referring to FIGS. 1, 6, 7 and 9, a condition of the simulation is the same as in case of FIG. 8. Specifically, the driving reference voltage Vdref was about 3 V (volt), the source voltage Vsource was about −3 V (volt), the amplifier reference voltage Varef was about 1.2 V (volt), the capacitance of the coupling capacitor 324 was about 0.08 pf (pico farad), the capacitance of the feedback capacitor 152 was about 0.2 pf (pico farad), the width/length of the amplifier 151 was about 20/45, the width/length of the first switching transistor 321 was about 20/45, the width/length of the second switching transistor 323 was about 20/45, the width/length of the light sensing capacitor 325 was about 70/13, the photo current of the first switching transistor 321 in case the light LIGHT is applied to the pixel 300 was about 100 pA (pico ampere), and the photo current of the first switching transistor 321 in case the light LIGHT is not applied to the pixel 300 was about 10 pA (pico amperes).

The voltage of the gate electrode in the driving transistor 322 is increased in response to the (n+1)-th gate signal G[n+1]. Specifically, the voltage of the gate electrode in the driving transistor 322 in case the light LIGHT is applied to the pixel 300 is greater than the voltage of the gate electrode in the driving transistor 322 in case the light LIGHT is not applied to the pixel 300

The second switching transistor 323 transfers the light sensing current generated from the driving transistor 322 in response to the n-th gate signal G[n], the readout circuit part 150 outputs the output voltage Vout corresponding to the light sensing current transferred from the readout line ROL.

The light sensing current in case the light LIGHT is applied to the pixel unit 300 is greater than the light sensing current in case the light LIGHT is not applied to the pixel unit 300. Therefore, the output voltage Vout in case the light LIGHT is applied to the pixel 300 is greater than the output voltage Vout in case the light LIGHT is not applied to the pixel 300. A change of the output voltage Vout according to whether the light LIGHT is applied to the pixel unit 300 or not was about 1.26 V (volt) as is indicated in the top waveform of FIG. 9.

According to the present exemplary embodiment, the light LIGHT is sensed using the light sensing capacitor 325 sensitive to the light LIGHT which can be a greater sensitivity than that of the first switching transistor 321 taken alone, and thus the effect of ambient light compared with the intended external light such as the laser point may be decreased. Thus, light sensing accuracy and light sensing signal to noise ratio (SNR) of the display apparatus 100 including the light sensing capacitor 325 may be improved.

Figure 10:
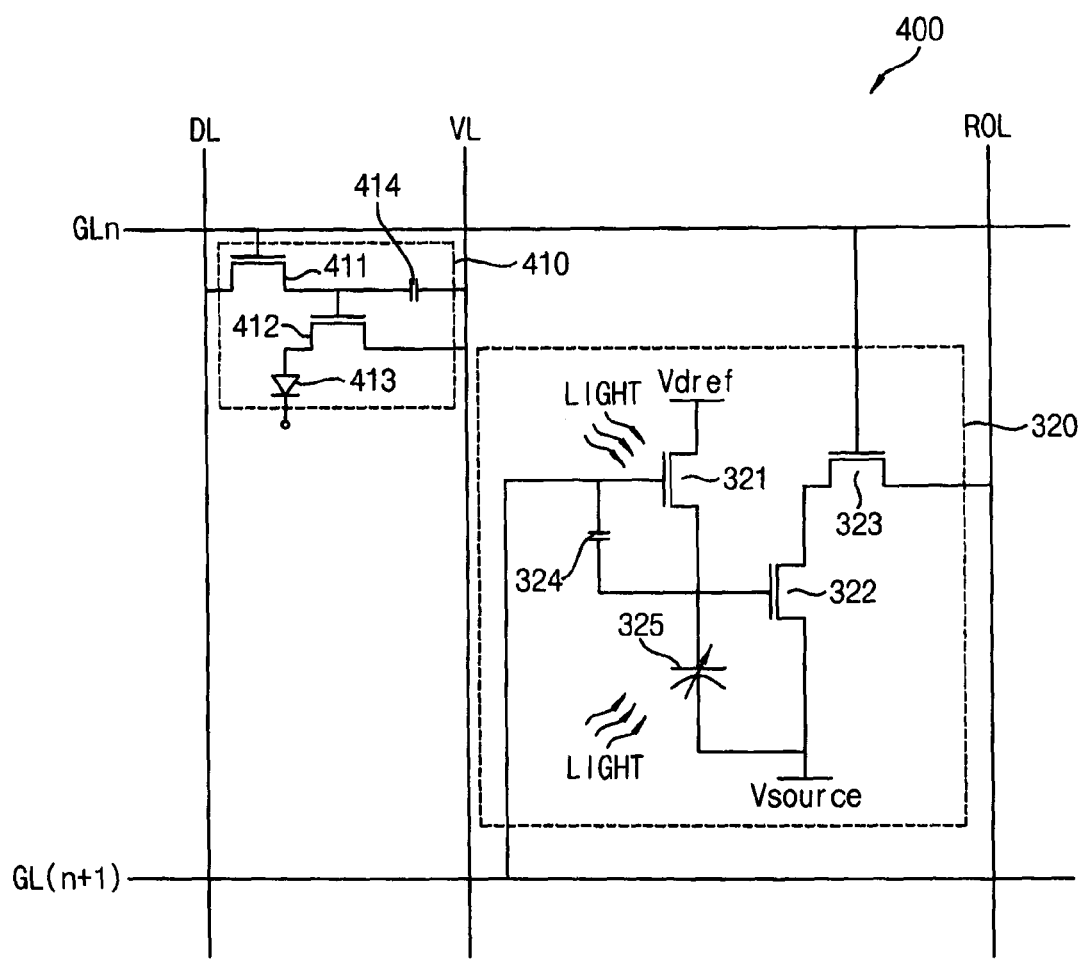
FIG. 10 is a circuit diagram illustrating still another exemplary embodiment in accordance with the present disclosure of invention.

FIG. 10 is a circuit diagram illustrating still another exemplary embodiment of the present disclosure of invention.

The pixel unit 400 according to the present exemplary embodiment may be substantially the same as the pixel unit 300 according to the previous exemplary embodiment illustrated in FIG. 7 except for the addition of a power line VL and a storage capacitor 414 and the organic light emitting diode (OLED) 413. Thus, substantially the same reference numerals will be used to refer to same or like parts as those described in the previous exemplary embodiment and any further repetitive explanation concerning the above elements will be omitted.

Referring to FIG. 10, the pixel unit 400 includes an image displaying circuit part 410 and the light sensitive circuit part 320.

The image displaying circuit part 410 performs a function of displaying an image. Specifically, the image displaying circuit part 410 a switching thin film transistor 411 electrically connected to the an n-th (n is a natural number) gate line GLn and a data line DL, a driving thin film transistor 412 connected between the switching thin film transistor 411 and a power line VL, a storage capacitor 414 connected between the switching thin film transistor 411 and the power line VL, and an organic light emitting diode 413 connected to the driving thin film transistor 412. Thus, a display panel including the pixel unit 400 may be an organic light emitting diodes display panel, and a display apparatus including the pixel unit 400 may be an organic light emitting diodes display apparatus.

The light sensitive circuit part 320 senses light LIGHT which, in one embodiment, is that having different wavelengths than generally emitted by the local OLED 413. For example, the light LIGHT may be intended external light such as that of a laser pointer. The light sensitive circuit part 320 includes the first switching transistor 321, the driving transistor 322, the second switching transistor 323, the coupling capacitor 324 and the light sensing capacitor 325.

The first switching transistor 321 is driven in response to the (n+1)-th gate signal applied to the (n+1)-th gate line GL(n+1) next to the n-th gate line GLn, and transfers the driving reference voltage Vdref which is the reference voltage of the driving transistor 322 to the gate electrode of the driving transistor 322. Specifically, the first switching transistor 321 includes the gate electrode electrically connected to the (n+1)-th gate line GL(n+1), the source electrode receiving the driving reference voltage Vdref and the drain electrode electrically connected to the gate electrode of the driving transistor 322. In addition, the first switching transistor 321 senses the light LIGHT and generates the photo current. Thus, the first switching transistor 321 may be the photo transistor.

The driving transistor 322 generates the light sensing current according to the voltage of the gate electrode in the driving transistor 322. Specifically, the driving transistor 322 includes the gate electrode electrically connected to the first switching transistor 321, the coupling capacitor 324 and the light sensing capacitor 325, the source electrode receiving the source voltage Vsource and the drain electrode electrically connected to the second switching transistor 323.

The second switching transistor 323 is driven in response to the n-th gate signal applied to the n-th gate line GLn and transfers the light sensing current generated from the driving transistor 322 to the readout line ROL in response to the n-th gate signal. Specifically, the second switching transistor 323 includes the gate electrode electrically connected to the n-th gate line GLn, the source electrode electrically connected to the driving transistor 322 and the drain electrode electrically connected to the readout line ROL.

The coupling capacitor 324 includes the first electrode electrically connected to the gate electrode of the first switching transistor 321 and the second electrode electrically connected to the gate electrode of the driving transistor 322. The coupling capacitor 324 generates the kickback voltage.

The light sensing capacitor 325 senses the light LIGHT. Thus, the capacitance of the light sensing capacitor 325 is increased in proportion to the intensity of the light LIGHT. The light sensing capacitor 325 includes the first electrode electrically connected to the gate electrode of the driving transistor 322 and the second electrode electrically connected to the source electrode of the driving transistor 322.

An operation of the light sensitive circuit part 320 in FIG. 10 is the same as following.

The first switching transistor 321 transfers the driving reference voltage Vdref to the gate electrode of the driving transistor 322 in response to the (n+1)-th gate signal applied to the (n+1)-th gate line.

When the (n+1)-th gate signal is inactivated, the kickback voltage is generated due to the coupling capacitor 324 and the light sensing capacitor 325. The kickback voltage may be calculated by equation 1 and equation 2. Thus, the kickback voltage in case the light sensing capacitor 325 receives the light LIGHT is less than the kickback voltage in case the light sensing capacitor 325 does not receive the light LIGHT. Therefore, the voltage of the gate electrode in the driving transistor 322 in case the light sensing capacitor 325 receives the light LIGHT is greater than the voltage of the gate electrode in the driving transistor 322 in case the light sensing capacitor 325 does not receive the light LIGHT. In addition, the first switching transistor 321 senses the light LIGHT during the frame period and generates the photo current, and thus the voltage of the gate electrode in the driving transistor 322 is increased. Thus, the light sensing current generated from the driving transistor 322 is increased in proportion to the intensity of the light LIGHT.

When the n-th gate signal is activated applied to the n-th gate line GLn after the frame period is elapsed, the second switching transistor 323 transfers the light sensing current generated from the driving transistor 322 to the readout line ROL in response to the n-th gate signal.

The readout circuit part 150 is connected to the readout line ROL and receives the light sensing current transferred from the readout line ROL to output the output voltage corresponding to the light sensing current.

According to the present exemplary embodiment, the light LIGHT is sensed using the light sensing capacitor 325 sensitive to the light LIGHT more than the first switching transistor 321 in the pixel 400 including the organic light emitting diode (OLED) 413, effect of ambient light compared with the intended external light such as the laser point may be decreased. Thus, light sensing accuracy and light sensing signal to noise ratio (SNR) of the organic light emitting display apparatus 100 including the light sensing capacitor 325 may be improved.

According to the light sensitive circuit, the light sensing panel having the light sensitive circuit and the display apparatus having the light sensing panel, effect of ambient light compared with intended external light such as a laser point may be decreased using a light sensing capacitor configured for sensing intended light. Thus, light sensing accuracy and light sensing signal to noise ratio (SNR) of a display apparatus including the light sensing capacitor may be improved.

The foregoing is illustrative of the present disclosure of invention and is not to be construed as limiting thereof. Although a few exemplary embodiments in accordance with the present teachings have been described, those skilled in the art will readily appreciate in view of the foregoing that many modifications are possible in the exemplary embodiments without materially departing from the novel teachings and advantages of the present disclosure. Accordingly, all such modifications are intended to be included within the scope of the present teachings. In the claims, means-plus-function clauses are intended to cover the structures described herein as performing the recited function and not only structural equivalents but also equivalent structures.

What is claimed is:

1. A light sensitive circuit comprising:
   a light sensitive capacitor configured to change its charge storing characteristics in response to received light of a predetermined one or more wavelengths;
   a driving transistor including a gate electrode electrically connected to the light sensitive capacitor; and
   a first switching transistor configured to be driven in response to an (n+1)-th (n is a natural number) gate signal which is activated in succession after activation of an n-th gate signal and to transfer a driving reference voltage to the gate electrode in the driving transistor, the driving reference voltage being a predetermined reference voltage, the n-th and (n+1)-th gate signals being signals generated by drive circuitry of the display panel,
   wherein the first switching transistor is a photo transistor that is responsive to a predetermined one or more wavelengths of light, and
   wherein the first switching transistor is directly connected to the driving transistor.

2. The light sensitive circuit of claim 1, wherein the light sensitive capacitor and the driving transistor are formed in a pixel unit of a display panel configured for displaying an image.

3. The light sensitive circuit of claim 1, further comprising:
   a coupling capacitor electrically connected to a gate electrode of the first switching transistor, to the gate electrode of the driving transistor and to the light sensitive capacitor.

4. The light sensitive circuit of claim 1, further comprising:
   a second switching transistor configured to be driven in response to the n-th gate signal and to transfer a light sensing current generated by the driving transistor to a readout line.

5. The light sensitive circuit of claim 1, wherein a capacitance of the light sensitive capacitor is increased in proportion to an intensity of light of a predetermined one or more wavelengths received by the light sensitive capacitor.

6. A light sensing panel comprising:
   a light sensitive circuit comprising a light sensitive capacitor configured to change its charge storing characteristics in response to received light of a predetermined one or more wavelengths, a driving transistor including a gate electrode electrically connected to the light sensitive capacitor and configured to generate a light sensing current according to a voltage of the gate electrode in the driving transistor, and a first switching transistor configured to be driven in response to an (n+1)-th (n is a natural number) gate signal next to an n-th gate signal and to transfer a driving reference voltage which is a reference voltage of the driving transistor to the gate electrode of the driving transistor;
   a plurality of gate lines configured for transferring the n-th gate signal and the (n+1)-th gate signal; and
   a plurality of data lines intersecting with the gate lines and configured for transferring data signals,
   wherein the first switching transistor is a photo transistor configured for sensing light of a predetermined one or more wavelengths, and
   wherein the first switching transistor is directly connected to the driving transistor.

7. The light sensing panel of claim 6, further comprising: a readout line configured for transferring the light sensing current.

8. The light sensing panel of claim 7, wherein the light sensitive circuit further comprises a second switching transistor configured to be driven in response to the n-th gate signal and to transfer the light sensing current generated by the driving transistor to the readout line.

9. The light sensing panel of claim 6, wherein the light sensing panel is a display panel configured for displaying an image.

10. The light sensing panel of claim 9, further comprising:
    a thin film transistor including a gate electrode electrically connected to the gate line, and a source electrode electrically connected to the data line;
    a liquid crystal capacitor electrically connected to a drain electrode of the thin film transistor; and
    a storage capacitor electrically connected to the drain electrode of the thin film transistor.

11. The light sensing panel of claim 9, further comprising:
    a switching thin film transistor electrically connected to the gate line and the data line;
    a driving thin film transistor electrically connected to the switching thin film transistor and a power line;
    an organic light emitting diode electrically connected to the driving thin film transistor; and
    a storage capacitor electrically connected to the switching thin film transistor and the power line.

12. The light sensing panel of claim 6, wherein the light sensitive circuit further comprises a coupling capacitor electrically connected to a gate electrode of the first switching transistor, the gate electrode of the driving transistor and the light sensing capacitor.

13. The light sensing panel of claim 6, wherein a capacitance of the light sensitive capacitor is increased in proportion to an intensity of received light of a predetermined one or more wavelengths.

14. A display apparatus comprising:
    a light sensing panel comprising a light sensitive circuit comprising a light sensing capacitor configured to sense light, a driving transistor including a gate electrode electrically connected to the light sensing capacitor and configured to generate a light sensing current according to a voltage of the gate electrode in the driving transistor and a first switching transistor configured to be driven in response to an (n+1)-th (n is a natural number) gate signal next to an n-th gate signal and transfer a driving reference voltage which is a reference voltage of the driving transistor to the gate electrode of the driving transistor, gate lines transferring the n-th gate signal and the (n+1)-th gate signal, and data lines intersecting with the gate lines and transferring data signals;
    a gate driving part configured to output the n-th gate signal and the (n+1)-th gate signal to the gate lines; and
    a data driving part configured to output data signals to the data lines,
    wherein the first switching transistor is a photo transistor configured for sensing light of a predetermined one or more wavelengths, and
    wherein the first switching transistor is directly connected to the driving transistor.

15. The display apparatus of claim 14, wherein the light sensing panel further comprises a readout line transferring the light sensing current.

16. The display apparatus of claim 15, further comprising:
    a readout circuit part electrically connected to the readout line, and configured to receive the light sensing current to output an output voltage corresponding to the light sensing current.

17. The display apparatus of claim 16, wherein the readout circuit part comprises:
- an amplifier including an inverting terminal to which the light sensing current is applied, a non-inverting terminal to which an amplifier reference voltage is applied, and an output terminal outputting the output voltage;
- a feedback capacitor electrically connected between the inverting terminal of the amplifier and the output terminal of the amplifier; and
- a switch configured to selectively connect the inverting terminal of the amplifier and the output terminal of the amplifier.

* * * * *